(12) United States Patent
Yan et al.

(10) Patent No.: US 12,401,735 B2
(45) Date of Patent: Aug. 26, 2025

(54) ELECTRONIC DEVICE

(71) Applicant: HONOR DEVICE CO., LTD., Shenzhen (CN)

(72) Inventors: Bin Yan, Shenzhen (CN); Kangle Xue, Shenzhen (CN); Xiulan Liu, Shenzhen (CN); Jiuliang Gao, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 261 days.

(21) Appl. No.: 17/794,218

(22) PCT Filed: Aug. 30, 2021

(86) PCT No.: PCT/CN2021/115288
§ 371 (c)(1),
(2) Date: Jul. 20, 2022

(87) PCT Pub. No.: WO2022/068497
PCT Pub. Date: Apr. 7, 2022

(65) Prior Publication Data
US 2023/0224394 A1    Jul. 13, 2023

(30) Foreign Application Priority Data
Sep. 30, 2020    (CN) .......................... 202022217809.3

(51) Int. Cl.
*H05K 1/14*    (2006.01)
*H04M 1/02*    (2006.01)
(Continued)

(52) U.S. Cl.
CPC ....... *H04M 1/0277* (2013.01); *H04M 1/0262* (2013.01); *H05K 1/115* (2013.01);
(Continued)

(58) Field of Classification Search
CPC ........ H05K 1/189; H05K 1/147; H05K 1/115; H05K 1/028; H05K 2201/10037;
(Continued)

(56) References Cited

U.S. PATENT DOCUMENTS

| | | | | |
|---|---|---|---|---|
| 2009/0186661 | A1* | 7/2009 | Kim | ...... H05K 1/147 455/566 |
| 2020/0042125 | A1* | 2/2020 | Lee | ...... H05K 1/189 |

(Continued)

FOREIGN PATENT DOCUMENTS

| | | |
|---|---|---|
| CN | 108600425 A | 9/2018 |
| CN | 109618030 A | 4/2019 |

(Continued)

*Primary Examiner* — Roshn K Varghese
(74) *Attorney, Agent, or Firm* — Fish & Richardson P.C.

(57) ABSTRACT

An electronic device includes a middle frame, a first flexible printed circuit FPC, a second FPC and a battery. Projections of the first FPC and the second FPC on the middle frame have a first overlapping region. The first overlapping region is located inside a projection of the battery on the middle frame and is far away from an edge of the battery. A first through hole is disposed on the middle frame. The first overlapping region is located in the first through hole. The electronic device provided in this application can implement reduction of an overall thickness, so that the electronic device provides better user experience.

19 Claims, 13 Drawing Sheets

(51) Int. Cl.
*H05K 1/11* (2006.01)
*H05K 1/18* (2006.01)

(52) U.S. Cl.
CPC ............. *H05K 1/147* (2013.01); *H05K 1/189* (2013.01); *H05K 2201/10037* (2013.01); *H05K 2201/10128* (2013.01)

(58) Field of Classification Search
CPC ...... H05K 2201/10128; H04M 1/0277; H04M 1/0262; G06F 1/1652
See application file for complete search history.

(56) References Cited

U.S. PATENT DOCUMENTS

2022/0155826 A1  5/2022  An et al.
2023/0224396 A1* 7/2023  Park ...................... H05K 1/189
                                                       361/679.01

FOREIGN PATENT DOCUMENTS

| CN | 214045690 U | 8/2021 |
| EP | 2293528 A1 | 3/2011 |
| EP | 2876868 A1 | 5/2015 |
| WO | 2020171447 A1 | 8/2020 |

* cited by examiner

--Prior Art--

--Prior Art--

ELECTRONIC DEVICE

CROSS-REFERENCE TO RELATED APPLICATIONS

This application is a National Stage of International Application No. PCT/CN2021/115288, filed on Aug. 30, 2021, which claims priority to Chinese Patent Application No. 202022217809.3, filed on Sep. 30, 2020. The disclosures of which are incorporated herein by reference in their entireties.

TECHNICAL FIELD

This application relates to the field of electronic product technologies, and in particular, to an electronic device.

BACKGROUND

With development of science and technology, consumer electronic products such as smartphones and tablet computers are popularized rapidly. This greatly promotes development of the society and facilitates people's life. To achieve an exquisite appearance and perfect user experience, an increasingly high requirement is posed on mobile phone design. How to make a mobile phone lighter and thinner becomes a major challenge to structure design.

In a current design solution, to reduce an overall thickness of a mobile phone, a three-section design architecture is usually used. A main board is disposed at an upper end of a battery, a sub-board is disposed at a lower end of the battery, and a main flexible printed circuit (flexible printed circuit, FPC) is used to connect the main board and the sub-board. In addition, as a standard component of the mobile phone, a display is usually connected to the main board through a built-in screen FPC. To make full use of internal space of the mobile phone, the main FPC is usually disposed between the battery and a middle frame, and the screen FPC is usually disposed between the display and the middle frame. Herein, the middle frame refers to a mechanical part between the screen and the battery, and may alternatively be a front cover in some solutions in the industry.

In this case, both the main FPC and the screen FPC are disposed in a thickness direction of the mobile phone. This inevitably increases the overall thickness of the mobile phone. The two FPCs and the middle frame overlap between the battery and the screen, and this becomes a thickness bottleneck of the entire mobile phone. In addition, an overlapping position is close to a battery edge. In consideration of battery safety, a hole design on the middle frame at the battery edge is not allowed. Moreover, due to a processing limit, a thickness of the middle frame cannot be further reduced. This is not conducive to lighting and thinning of the mobile phone.

SUMMARY

A technical problem to be resolved in embodiments of this application is to provide an electronic device with a relatively small overall thickness.

According to a first aspect, an electronic device is provided, including a middle frame, a first flexible printed circuit FPC, a second FPC, and a battery. Projections of the first FPC and the second FPC on the middle frame have a first overlapping region, the first overlapping region is located inside a projection of the battery on the middle frame and is far away from an edge of the battery, a first through hole is disposed on the middle frame, and the first overlapping region is located in the first through hole.

According to the electronic device provided in embodiments of this application, the first through hole is disposed on the middle frame, a position of the first through hole is corresponding to the overlapping region between the first FPC and the second FPC, and a projection of the overlapping region is completely located in the first through hole, so that a thickness of the overlapping region includes thicknesses of only the first FPC and the second FPC (for example, the FPC's can be flexibly deformed, and the two FPCs may be put close to the first through hole). In other words, a hole is punched on the middle frame at the overlapping region of the two FPCs, so that only two components overlap in the overlapping region. In addition, only two components (the first FPC and the middle frame, or the second FPC and the middle frame) overlap at any other position in the projection of the battery. Compared with that in a conventional solution (a sum of thicknesses of two FPCs and a middle frame constitutes a bottleneck of an overall thickness), the electronic device provided in embodiments of this application has one less component in the thickness direction, which helps reduce the overall thickness of the electronic device (the overall thickness may be reduced by 0.1 millimeter to 0.2 millimeter or more). In this way, the overall thickness can be reduced, so that the electronic device provides better user experience.

Further, the overlapping region between the two FPCs of the electronic device provided in embodiments of this application is located inside the projection of the battery on the middle frame, and is far away from the edge of the battery, so that the position of the first through hole can be far away from the edge of the battery. In this way, the middle frame can better support and protect the battery. Because a burr that may be generated when a hole is punched on the middle frame does not damage the relatively fragile edge position of the battery, use safety performance of the battery can be ensured. This helps improve overall performance of the electronic device.

It should be understood that, in embodiments of this application, the first through hole is larger than the overlapping region, so that the projection of the overlapping region can be completely located in the first through hole. However, the first through hole should not be excessively large, to avoid affecting support performance of the middle frame. In addition, the first through hole should be away from the edge of the battery as far as possible, to ensure use safety performance of the battery.

Herein, an overlapping region (that is, the foregoing first overlapping region) is inside the projection of the battery on the middle frame, and is far away from the edge of the battery. That the overlapping region is far away from the edge of the battery may mean that the overlapping region is not close to the edge of the battery, and a disposing position of the first through hole that is determined based on the overlapping region is not close to the edge of the battery, so that no adverse effect is caused on the edge of the battery (for example, an internal electrode).

Optionally, the first through hole and the first overlapping region have a same shape and a same size. In this case, contours of the first through hole and the first overlapping region completely overlap.

For example, both the first through hole and the first overlapping region are rectangular.

Optionally, the first through hole is larger than the first overlapping region, and the first overlapping region is completely located in the first through hole. In this case, a shape of the first through hole and a shape of the first overlapping region may be the same or different. This is not limited in this application.

For example, both the first through hole and the first overlapping region are rectangular, and the first through hole is larger than the first overlapping region.

For another example, the first overlapping region is rectangular, a shape of the first through hole is any one of a circle, an oval, a trapezoid, a rhombus, an irregular shape, or the like, an area of the first through hole is larger than that of the first overlapping region, and the first overlapping region is completely located in the first through hole.

Optionally, the first FPC and the second FPC may be located on two opposite sides of the middle frame.

Optionally, the first FPC and the second FPC may alternatively be located on a same side of the middle frame, for example, both are located between the middle frame and the display, or both are located between the middle frame and the battery. This is not limited in this application. In a possible design, an avoidance hole is disposed on the first FPC, and the first FPC avoids the second FPC by using the avoidance hole, so that the first overlapping region is far away from the edge of the battery.

A main purpose of the avoidance hole is to avoid the second FPC within a specific range from the edge of the battery. To implement an avoidance effect, the projection of the avoidance hole on the middle frame should completely cover a projection of the second FPC on the opposite side. In this case, a width of the avoidance hole should be greater than or equal to a width of the second FPC.

Optionally, the first FPC may be in any shape, such as a rectangle, a rhombus, a trapezoid, a circle, or any irregular shape. This is not limited in this application.

In a possible design, the middle frame includes a protrusion part, a front end of the protrusion part extends into the avoidance hole, and a rear end of the protrusion part forms avoidance space accommodating the second FPC.

Optionally, the front end of the protrusion part may be embedded in the avoidance hole. Alternatively, the front end of the protrusion part is disposed near (close to) the avoidance hole.

In embodiments of this application, the protrusion part and the avoidance space are disposed, so that a region in the avoidance hole also has a thickness of only two components (the middle frame and the second FPC), which helps reduce the overall thickness of the electronic device. In this way, the overall thickness can be reduced, so that the electronic device provides better user experience.

In a possible design, the projections of the first FPC and the second FPC on the middle frame have a second overlapping region, the first FPC further includes a thinning region, a thickness of the thinning region is less than a thickness of another region of the first FPC, and a projection of the thinning region on the middle frame covers the second overlapping region.

In a possible design, the first overlapping region is connected to the second overlapping region.

In a possible design, the first FPC includes an FPC body and a functional film layer that are stacked, and thinning is performed on the FPC body and/or the functional film layer to form the thinning region.

In a possible design, the functional film layer includes a protective film layer and a shielding film layer.

In a possible design, a first groove and a second groove are respectively disposed on two side surfaces of the middle frame, the first FPC is disposed in the first groove, and the second FPC is disposed in the second groove.

In a possible design, the first FPC is a screen FPC of the electronic device, and the second FPC is a main FPC of the electronic device.

Optionally, the first FPC is electrically connected to the display and the main board through welding, and the second FPC is electrically connected to the main board and the sub-board through welding.

Optionally, the first FPC is electrically connected to the display and the main board through a connector, and the second FPC is electrically connected to the main board and the sub-board through a connector.

For example, the connector may be a zero insertion force connector or a board to board connector.

In a possible design, the first FPC is fixedly attached to an inner surface of a display of the electronic device by using a first back adhesive layer, and the second FPC is fixedly attached to the middle frame by using a second back adhesive layer.

In a possible design, a third groove is further disposed on the middle frame in the second groove, and the second back adhesive layer is disposed in the third groove.

In a possible design, the first FPC passes through a second through hole disposed on the middle frame and is electrically connected to a main board of the electronic device.

Figure 1:
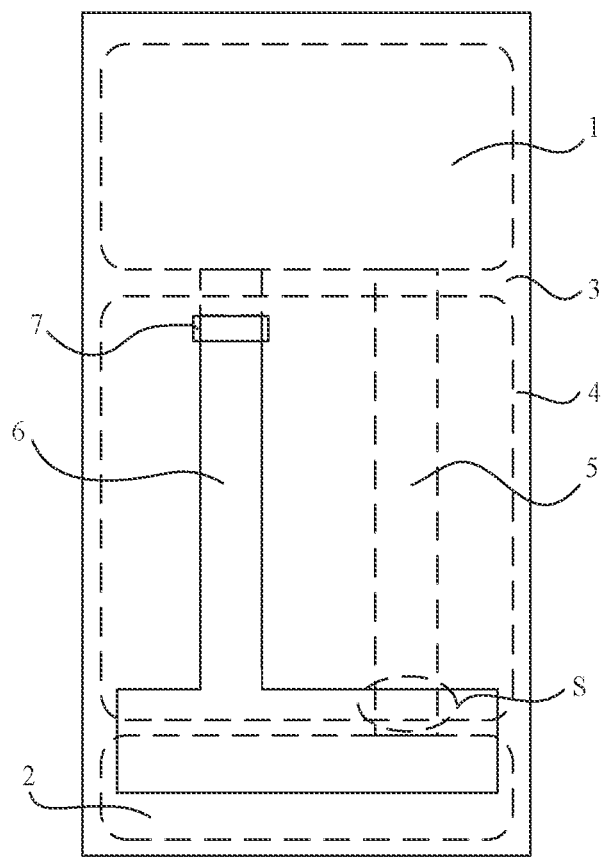
FIG. 1 is a schematic diagram of an overall structure of a smartphone from a perspective in the conventional technology.

Reference numerals: 1. main board; 2. sub-board; 3. middle frame; 4. battery; 5. main FPC; 6. screen FPC; 7. perforation; 8. display; S, overlapping region; 10. housing; 20. display; 30. middle frame; 31. first through hole; 32. second through hole; 33. first groove; 34. second groove; 35. third groove; 36. middle-frame battery compartment; 37. protrusion part; 38, avoidance space; 40. first FPC; 40a. FPC body; 40b. functional film layer; 41 avoidance hole; 42. first back adhesive layer; 43. thinning region; 50. second FPC; 51. second back adhesive layer; 52. bending part; 60. battery; 61. third back adhesive layer; 70. main board; 80. sub-board; 90. bezel; 100. electronic device; s1. first overlapping region; s2. second overlapping region.

DESCRIPTION OF EMBODIMENTS

The following describes in detail implementations of this application, examples of the implementations are shown in the accompanying drawings, and identical or similar reference numerals represent identical or similar elements or elements having identical or similar functions. The following implementations described with reference to the accompanying drawings are examples, and are merely intended to explain this application, but should not be construed as a limitation on this application.

In the descriptions of this application, it should be understood that the terms "first", "second", and "third" are merely used for description, but should not be understood as indicating or implying relative importance or implying a quantity of indicated technical features. Therefore, a feature limited by "first", "second", or "third" may explicitly or implicitly include one or more features. In the descriptions of this application. "a plurality of" means two or more, unless otherwise specifically limited.

In the descriptions of this application, it should be noted that, unless otherwise specified and limited, the terms "mount" and "connect" should be understood in a broad sense, for example, may indicate a fixed connection, a detachable connection, an integral connection, a mechanical connection, an electrical connection, mutual communication, a direct connection, an indirect connection through an intermediate medium, an internal connection between two elements, or an interaction relationship between two elements. A person of ordinary skill in the art may understand a specific meaning of the foregoing term in this application according to a specific situation.

In the descriptions of this application, it should be understood that an orientation relationship or a position relationship indicated by terms "top", "bottom", "side". "front", and "rear" are an orientation relationship or a position relationship based on mounting, and is merely for ease of description and simplification of this application, but is not intended to indicate or imply that a specified apparatus or element necessarily has a specific orientation or is constructed and operated in a specific orientation. Therefore, the terms should not be construed as a limitation on this application.

In the descriptions of this application, it should be noted that the term "and/or" is merely an association relationship for describing associated objects, and indicates that three relationships may exist. For example, A and/or B may indicate the following three cases: Only A exists, both A and B exist, and only B exists.

It should be further noted that in embodiments of this application, a same reference numeral indicates a same part or a same component. For a same component or part in embodiments of this application, only one component or part may be marked with a reference numeral in the figure as an example. It should be understood that, for another same component or part, the reference numeral is also applicable.

With development of science and technology, consumer electronic products such as smartphones and tablet computers are popularized rapidly. This greatly promotes development of the society and facilitates people's life. To achieve an exquisite appearance and perfect user experience, an increasingly high requirement is posed on mobile phone design. How to make a mobile phone lighter and thinner becomes a major challenge to structure design.

A flexible printed circuit (flexible printed circuit. FPC) is a printed circuit board made of a flexible insulation material. The flexible printed circuit has many advantages that a rigid printed circuit board (printed circuit board, PCB) does not have. For example, the FPC may be bent, wound, or folded freely, and may be arranged based on a space layout requirement, to implement integration of component assembly and wire connection. Because of the foregoing advantages, using the FPC can effectively reduce a volume or a thickness of an electronic product, and improve circuit arrangement flexibility, to meet high density, miniaturization, and high reliability requirements on the electronic product.

Figure 2:
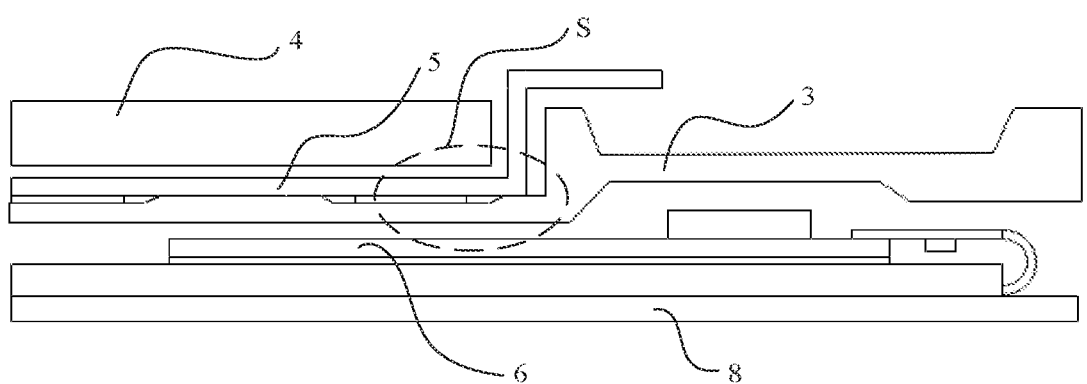
FIG. 2 is a schematic diagram of an overall structure of a smartphone from another perspective in the conventional technology.

In a current design solution, to reduce an overall thickness of a mobile phone, a three-section design architecture is usually used, that is, a mechanical design of main board+battery+sub-board. The main board and the sub-board are electrically connected through an FPC. FIG. 1 is a schematic diagram of an overall structure of a smartphone from a perspective in the conventional technology. FIG. 2 is a schematic diagram of an overall structure of a smartphone from another perspective in the conventional technology.

As shown in FIG. 1 and FIG. 2, a middle frame 3 and a battery 4 are successively disposed between a display 8 and a rear cover (not shown in the figures) of the smartphone. A main board 1, a sub-board 2, and the battery 4 are disposed in parallel, the main board 1 is disposed at an upper end of the battery 4, the sub-board 2 is disposed at a lower end of the battery 4, and the main board 1 and the sub-board 2 are electrically connected through a main FPC 5. The display is electrically connected to the main board 1 through a built-in screen FPC 6. To make full use of internal space of the smartphone, the main FPC 5 is disposed between the battery 4 and the middle frame 3, and the screen FPC 6 is disposed between the display 8 and the middle frame 3. In other words, the main FPC 5 and the screen FPC 6 are respectively disposed on two opposite sides of the middle frame 3.

Further, as shown in FIG. 1, the screen FPC 6 is located on a front side of the middle frame 3, the main board 1, the sub-board 2, the battery 4, and the main FPC 5 are located on a rear side of the middle frame 3, and the main FPC 5 passes between the middle frame 3 and the battery 4 to connect the main board 1 and the sub-board 2. Because the screen FPC 6 and the main board 1 are located on two opposite sides of the middle frame 3, to implement connection between the screen FPC 6 and the main board 1, a perforation 7 may be disposed on the middle frame 3. One end of the screen FPC 6 is electrically connected to the display 8, and the other end of the screen FPC 6 passes through the perforation 7, and is electrically connected to the main board 1 on the rear side of the middle frame 3.

Because both the main FPC 5 and the screen FPC 6 are disposed in a thickness direction of the smartphone, an overall thickness of the mobile phone inevitably increases.

As shown in FIG. 1 and FIG. 2, the two FPCs and the middle frame 3 have an overlapping region S between the battery 4 and the display 8, and a thickness of the overlapping region S is a sum of thicknesses of the two FPCs and the middle frame 3. Existence of the overlapping region S becomes a design bottleneck of the overall thickness.

The overlapping region S is close to an edge of the battery 4. A plurality of electrodes are disposed inside the edge of the battery 4. If a hole is punched on the middle frame 3, a burr is likely to appear on the middle frame 3. The burr is likely to puncture the battery 4, causing a short circuit between the electrodes inside the battery 4, and affecting safety performance of the battery 4.

In other words, in consideration of safety of the battery 4, punching is usually not allowed on the middle frame 3 at the edge of the battery 4. In addition, a thickness of the middle frame 3 has a processing limit (for example, in a current processing technology, a limit thickness of the middle frame is 0.35 mm), and further thinning cannot be achieved. This impedes lighting and thinning design of the smartphone, and is not conducive to lighting and thinning development of the smartphone.

In conclusion, in embodiments of this application, an inner structure of an electronic device is improved, to provide an electronic device with a relatively small overall thickness, so as to improve user experience.

An embodiment of this application provides an electronic device. The electronic device may be a device such as a mobile phone (for example, a common mobile phone or a foldable mobile phone), a tablet computer, a notebook computer, or a wearable device, but is not limited thereto.

Figure 3:
FIG. 3 is a schematic diagram of an overall structure of an electronic device according to an embodiment of this application.

FIG. 3 is a schematic diagram of an overall structure of an electronic device 100 according to an embodiment of this application. By way of example and not limitation, in this embodiment of this application, the electronic device 100 is a mobile phone, and includes a housing 10 and a display 20. The display 20 is mounted on the housing 10. The electronic device 100 further includes electronic components (not shown in the figure) disposed inside the housing 10. The electronic components include but are not limited to a circuit board, a processor, a camera, a flash, a microphone, a battery, and the like.

The housing 10 may be a metal housing, for example, a metal such as a magnesium alloy or a stainless steel. Alternatively, the housing 10 may be a plastic housing, a glass housing, a ceramic housing, or the like, but is not limited thereto. The housing 10 includes structures such as a bezel and a rear cover.

As a front panel of the electronic device 100, the display 20 forms accommodation space with the housing 10. The accommodation space is used to accommodate an electronic component or a function component of the electronic device 100. The display 20 forms a display surface of the electronic device 100, and is configured to display information such as an image and a text. The display 20 may be a light-emitting diode (light-emitting diode. LED) display, a liquid crystal display (liquid crystal display, LCD), an organic light-emitting diode (organic light-emitting diode. OLED) display, or the like, but is not limited thereto. In addition, the display 20 may be a foldable display (flexible display).

Figure 4:
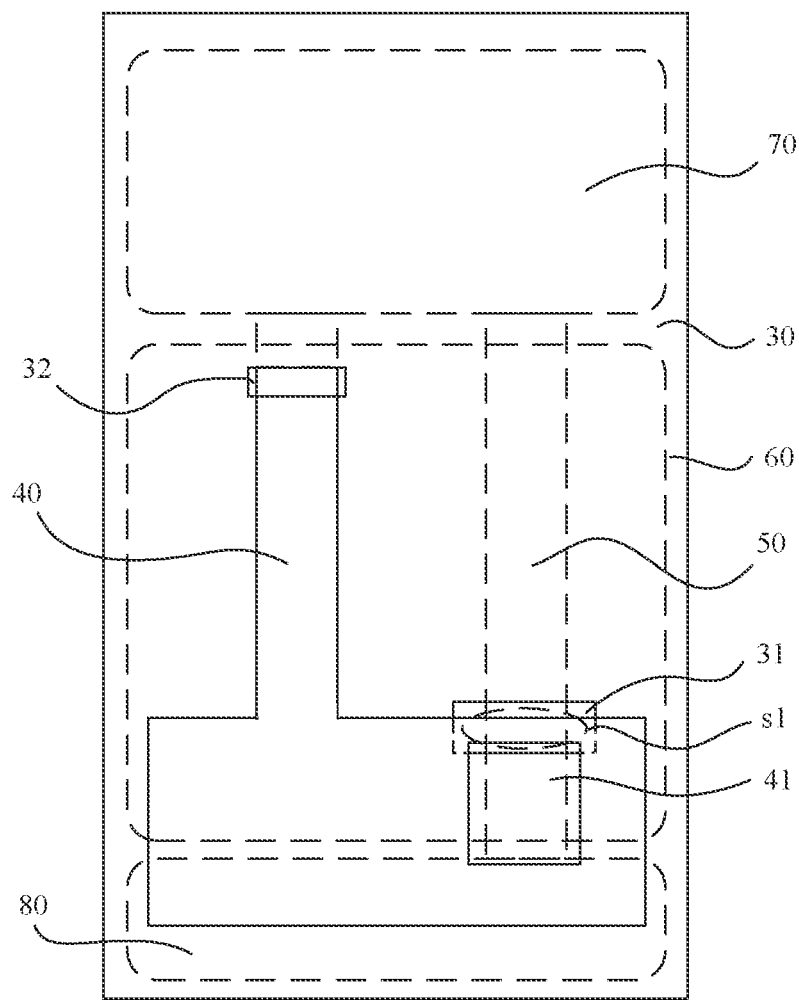
FIG. 4 is a schematic connection diagram of a partial inner structure of an electronic device according to an embodiment of this application.
Figure 5:
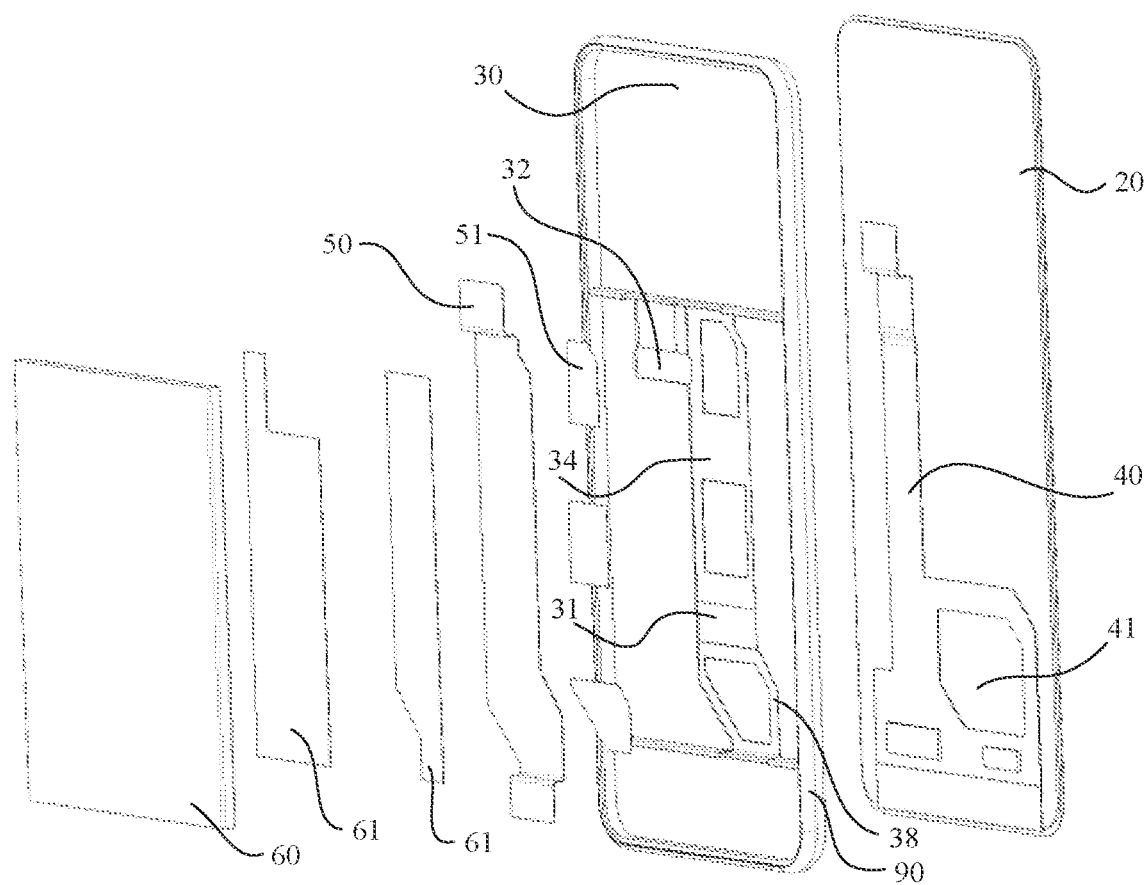
FIG. 5 is an exploded view of an electronic device from a perspective according to an embodiment of this application.
Figure 6:
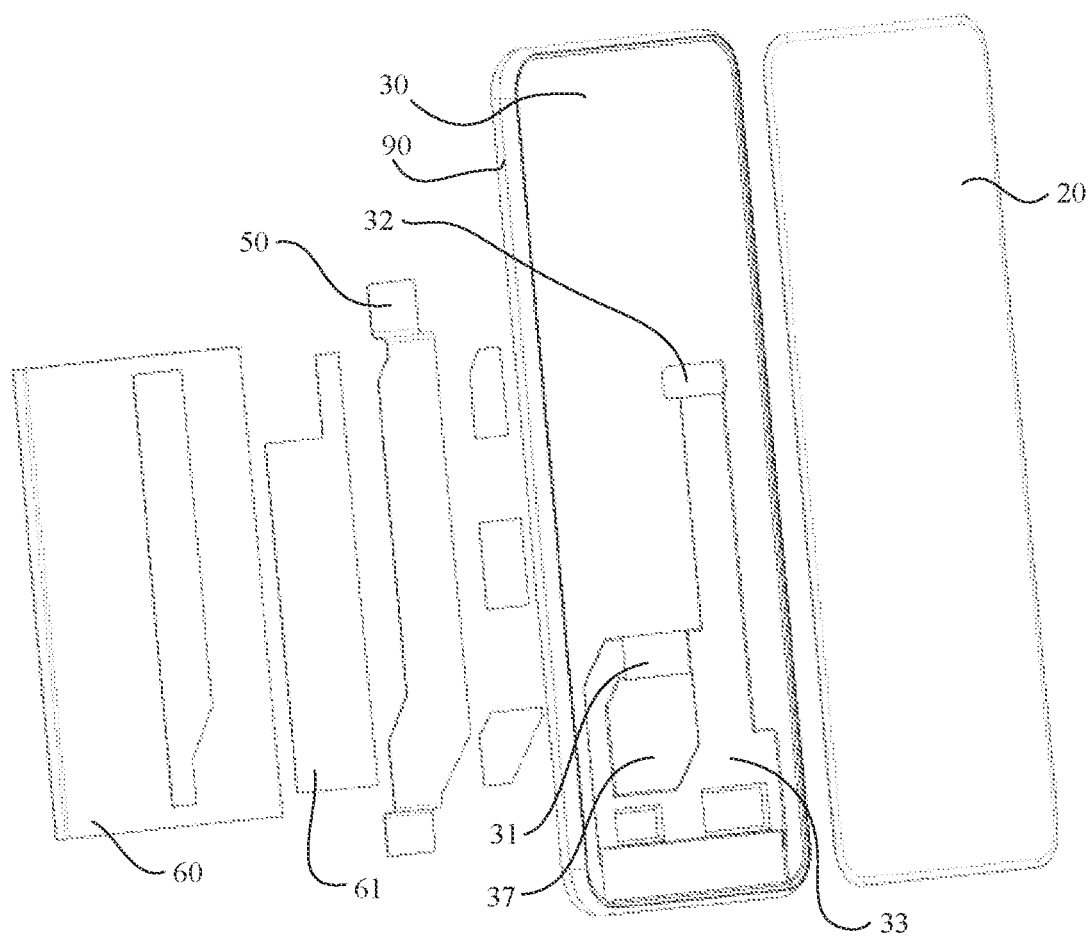
FIG. 6 is an exploded view of an electronic device from another perspective according to an embodiment of this application.
Figure 7:
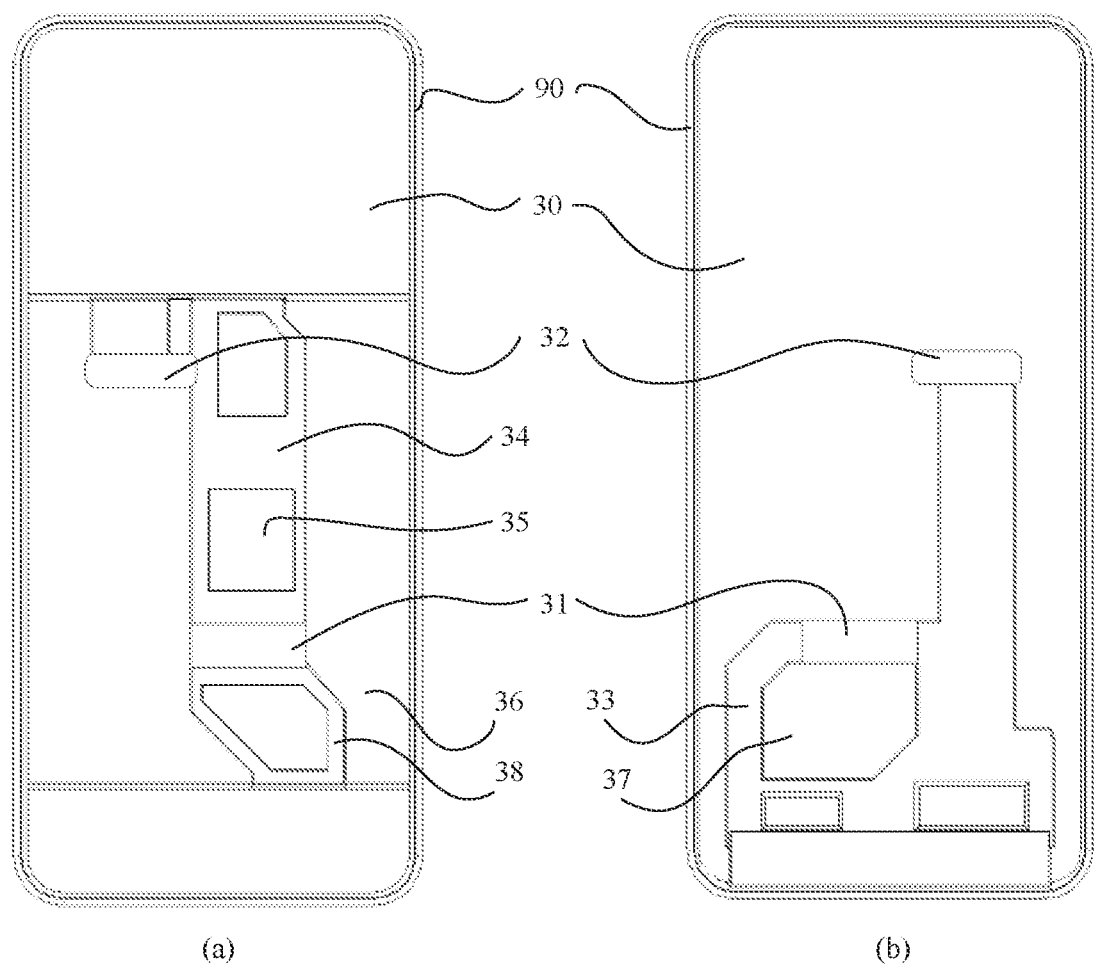
FIG. 7 is a schematic diagram of a structure of a main board according to an embodiment of this application.
Figure 8:
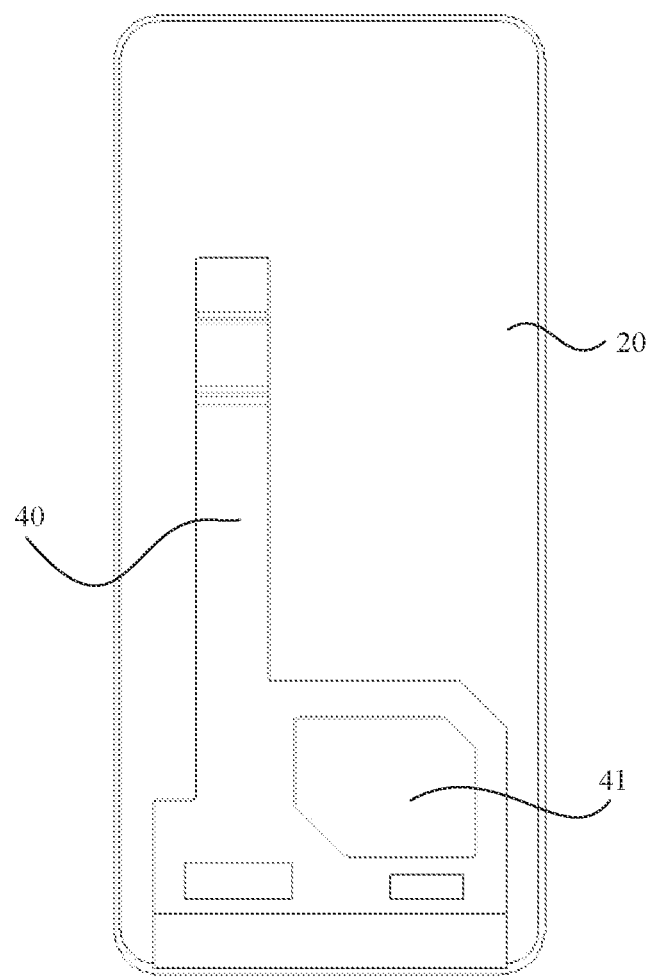
FIG. 8 is a schematic diagram of a structure of a display from a perspective according to an embodiment of this application.

FIG. 4 is a schematic connection diagram of a partial inner structure of the electronic device 100 according to an embodiment of this application. FIG. 5 is an exploded view of the electronic device 100 from a perspective according to an embodiment of this application. FIG. 6 is an exploded view of the electronic device 100 from another perspective according to an embodiment of this application. FIG. 7 is a schematic diagram of a structure of a main board 70 according to an embodiment of this application. FIG. 8 is a schematic diagram of a structure of the display 20 from a perspective according to an embodiment of this application.

As shown in FIG. 4 to FIG. 8, the electronic device 100 provided in embodiments of this application includes a middle frame 30, a first flexible printed circuit FPC 40, a second FPC 50, and a battery 60. The first FPC 40 and the second FPC 50 are respectively disposed on two opposite sides of the middle frame 30.

Projections of the first FPC 40 and the second FPC 50 on the middle frame 30 have a first overlapping region s1, and the first overlapping region s1 is located inside a projection of the battery 60 on the middle frame 30 and is away from an edge of the battery 60.

A first through hole 31 is disposed on the middle frame 30, and the first overlapping region s1 is located in the first through hole 31.

A flexible printed circuit (flexible printed circuit, FPC) is briefly referred to as a flexible board, and is also referred to as a "flexible line board" or "flexible circuit board". The flexible printed circuit is a highly reliable and optimal flexible printed circuit board made by using polyimide or polyester film as a material.

In this application, the flexible printed circuit also includes a flexible-rigid structure board. In this case, a partial region may be a rigid circuit board.

In embodiments of this application, the middle frame 30 is disposed inside the electronic device 100. The middle frame 30 divides inner accommodation space of the electronic device 100 into two parts: accommodation space between the display 20 and the middle frame 30 and accommodation space between the middle frame 30 and the rear cover. The first FPC 40 is disposed in the accommodation space between the display 20 and the middle frame 30, and the second FPC 50 is disposed in the accommodation space between the middle frame 30 and the rear cover, that is, the first FPC 40 and the second FPC 50 are respectively disposed on two opposite sides of the middle frame 30.

Further, the electronic device 100 includes the battery 60. The battery 60 is disposed in the accommodation space between the middle frame 30 and the rear cover, and the second FPC 50 is located between the middle frame 30 and the battery 60.

As shown in FIG. 4, the first FPC 40 and the second FPC 50 have an overlapping (or intersection) region More specifically, the projections of the first FPC 40 and the second FPC 50 on the middle frame 30 have the first overlapping region s1, and the first overlapping region s1 is located inside the projection of the battery 60 on the middle frame 30 and is away from the edge of the battery 60.

As shown in FIG. 4 to FIG. 7, in embodiments of this application, the first through hole 31 is disposed on the middle frame 30, the first through hole 31 penetrates two sides of the middle frame 30, and the first overlapping region s1 is located in the first through hole 31. To be specific, a shape and a size of the first through hole 31 match those of the first overlapping region s1.

Optionally, the first through hole 31 and the first overlapping region s1 have a same shape and a same size. In this case, contours of the first through hole 31 and the first overlapping region s1 completely overlap.

As shown in FIG. 4 to FIG. 7, in embodiments of this application, both the first through hole 31 and the first overlapping region s1 are rectangular.

Optionally, the first through hole 31 is larger than the first overlapping region s1, and the first overlapping region s1 is completely located in the first through hole 31. In this case, a shape of the first through hole 31 and a shape of the first overlapping region s1 may be the same or different. This is not limited in this application.

For example, both the first through hole 31 and the first overlapping region s1 are rectangular, and the first through hole 31 is larger than the first overlapping region s1.

For another example, the first overlapping region s1 is rectangular, a shape of the first through hole 31 is any one of a circle, an oval, a trapezoid, a rhombus, an irregular shape, or the like, an area of the first through hole 31 is larger than that of the first overlapping region s1, and the first overlapping region s1 is completely located in the first through hole 31.

According to the electronic device 100 provided in embodiments of this application, the first through hole 31 is disposed on the middle frame 30, a position of the first through hole 31 is corresponding to the overlapping region between the first FPC 40 and the second FPC 50, and the projection of the overlapping region is completely located in the first through hole 31, so that a thickness of the overlapping region includes only thicknesses of the first FPC 40 and the second FPC 50 (for example, the FPCs can be flexibly deformed, and the two FPCs may be put close to the first through hole 31). In other words, a hole is punched on the middle frame 30 at the overlapping region of the two FPCs, so that only two components overlap in the overlapping region. In addition, only two components (the first FPC 40 and the middle frame 30, or the second FPC 50 and the middle frame 30) overlap at any other position in the projection of the battery 60. Compared with that in a conventional solution (a sum of thicknesses of two FPCs and a middle frame constitutes a bottleneck of an overall thickness), the electronic device 100 provided in embodiments of this application has one less component in the thickness direction, which helps reduce the overall thickness of the electronic device 100 (the overall thickness may be reduced by 0.1 millimeter to 0.2 millimeter or more). In this way, the overall thickness can be reduced, so that the electronic device 100 provides better user experience.

Further, the overlapping region between the two FPCs of the electronic device 100 provided in embodiments of this application is located inside the projection of the battery 60 on the middle frame 30, and is far away from the edge of the battery 60, so that the position of the first through hole 31 can be far away from the edge of the battery 60. In this way, the middle frame 30 can better support and protect the battery 60. Because a burr that may be generated when a hole is punched on the middle frame 30 does not damage the relatively fragile edge position of the battery 60, use safety performance of the battery 60 can be ensured. This helps improve overall performance of the electronic device 100.

It should be understood that, in embodiments of this application, the first through hole 31 is larger than the overlapping region, so that the projection of the overlapping region can be completely located in the first through hole. However, the first through hole 31 should not be excessively large, to avoid affecting support performance of the middle frame 30. In addition, the first through hole 31 should be away from the edge of the battery 60 as far as possible, to ensure use safety performance of the battery 60.

It should be noted that the electronic device 100 provided in embodiments of this application is not limited to the foregoing three-section architecture design, and another architecture design may also be applicable.

In embodiments of this application, the first FPC 40 and the second FPC 50 are respectively disposed on two opposite sides of the middle frame 30. In another implementation, the first FPC 40 and the second FPC 50 may alternatively be located on a same side of the middle frame 30, for example, both are located between the middle frame 30 and the display 20, or both are located between the middle frame 30 and the battery 60. This is not limited in this application.

Herein, an overlapping region (that is, the foregoing first overlapping region s1) is inside the projection of the battery 60 on the middle frame 30, and is far away from the edge of the battery 60. That the overlapping region is far away from the edge of the battery 60 may mean that the overlapping region is not close to the edge of the battery 60, and a disposing position of the first through hole 31 that is determined based on the overlapping region is not close to the edge of the battery 60, so that no adverse effect is caused on the edge of the battery 60 (for example, an internal electrode).

How to make the overlapping region between the first FPC and the second FPC inside the battery 60 and away from the edge of the battery 60 is not limited in embodiments of this application. Positions (for example, orientations) for disposing the first FPC and the second FPC may be arbitrarily arranged according to a specific requirement, to achieve the foregoing objective. This is not limited in this application.

In embodiments of this application, a hole is added to the first FPC to avoid overlapping of the two FPCs at the edge of the battery 60, and an overlapping position (that is, the foregoing first overlapping region s1) is transferred to the inside of the projection of the battery 60 and is far away from the edge of the battery 60.

Specifically, as shown in FIG. 4 to FIG. 8, in embodiments of this application, an avoidance hole 41 is disposed on the first FPC 40, the avoidance hole 41 is a through hole, and the first FPC 40 avoids the second FPC 50 by using the avoidance hole 41, so that the first overlapping region s1 is far away from the edge of the battery 60.

In this case, a projection of the avoidance hole 41 on the middle frame 30 is connected to the projection of the first overlapping region s1, and after passing through the avoidance hole 41, the second FPC 50 overlaps the first FPC 40 to form the first overlapping region s1.

A main purpose of the avoidance hole 41 is to avoid the second FPC 50 within a specific range from the edge of the battery 60. To implement an avoidance effect, the projection of the avoidance hole 41 on the middle frame 30 should completely cover a projection of the second FPC 50 on the opposite side. In this case, a width of the avoidance hole 41 should be greater than or equal to a width of the second FPC 50.

Optionally, the first FPC 40 may be in any shape, such as a rectangle, a rhombus, a trapezoid, a circle, or any irregular shape. This is not limited in this application.

In embodiments of this application, the first FPC 40 is a screen FPC of the electronic device 100, and the second FPC 50 is a main FPC of the electronic device 100.

Specifically, as shown in FIG. 4 to FIG. 8, the electronic device 100 further includes a main board 70 and a sub-board 80. The first FPC 40 may be a screen FPC. In this case, one end of the first FPC 40 is electrically connected to the display 20 (the first FPC 40 may be considered as a part of a display module), and the other end of the first FPC 40 is electrically connected to the main board 70 after passing through a second through hole 32 disposed on the middle frame 30.

The second FPC 50 may be a main FPC of the electronic device 100. In this case, one end of the second FPC 50 is electrically connected to the main board 70, and the other end of the second FPC 50 is electrically connected to the sub-board 80. In this case, the second FPC 50 may be located between the middle frame 30 and the battery 60.

Optionally, the first FPC 40 is electrically connected to the display 20 and the main board 70 through welding, and the second FPC 50 is electrically connected to the main board 70 and the sub-board 80 through welding.

Optionally, the first FPC 40 is electrically connected to the display 20 and the main board 70 through a connector, and the second FPC 50 is electrically connected to the main board 70 and the sub-board 80 through a connector.

For example, the connector may be a zero insertion force (zero insertion force. ZIF) connector or a board to board (board to board, BTB) connector.

Optionally, the first FPC 40 may be a conventional FPC, or may be a special flexible board such as a chip on film (chip on flex or chip on film, COF) or a chip on plastic (chip on plastic, COP). This is not limited in this application.

Optionally, a main circuit, a chip, a sensor, an interface, a plug-in, and the like of the electronic device 100 may be disposed on the main board 70, and a USB interface, an antenna contact, a radio frequency interface, and the like of the electronic device 100 may be disposed on the sub-board 80.

Optionally, in another implementation, the first FPC 40 may be an FPC that implements an electrical connection to another component and that is other than the screen FPC and the main FPC, and the second FPC 50 may be an FPC that implements an electrical connection to another component and that is other than the screen FPC and the main FPC. This is not limited in this application.

Optionally, the battery 60 may be a lithium battery or a nickel-cadmium battery. This is not limited in this application.

As shown in FIG. 5 to FIG. 7, the electronic device 100 further includes a bezel 90. The bezel 90 is disposed around an outer circumference of the middle frame 30 and is fixedly connected to the middle frame 30. The bezel 90 and the middle frame 30 may be integrally molded.

As shown in FIG. 5 to FIG. 7, a first groove 33 and a second groove 34 are respectively disposed on two side surfaces of the middle frame 30, the first FPC 40 is disposed in the first groove 33, and the second FPC 50 is disposed in the second groove 34.

Specifically, the first groove 33 and the second groove 34 may be respectively disposed on the two side surfaces of the middle frame 30, a shape of the first groove 33 is consistent with a shape of the first FPC 40, and the first FPC 40 is correspondingly embedded in the first groove 33.

Optionally, a depth of the first groove 33 matches a height of the first FPC 40. For example, the depth of the first groove 33 may be greater than, less than, or equal to the height of the first FPC 40.

Further, the second through hole 32 is disposed at an end of the first groove 33, and an end of the first FPC 40 passes through the second through hole 32 and is electrically connected to the main board 70 on the other side of the middle frame 30.

A shape of the second groove 34 is consistent with a shape of the second FPC 50, and the second FPC 50 is correspondingly embedded in the second groove 34.

Optionally, a depth of the second groove 34 matches a height of the second FPC 50. For example, the depth of the second groove 34 may be greater than, less than, or equal to the height of the second FPC 50.

In embodiments of this application, the groove is disposed on the middle frame 30 to accommodate the FPC, so that the FPC can be better positioned and fastened, and this helps further reduce the thickness of the electronic device 100.

Figure 9:
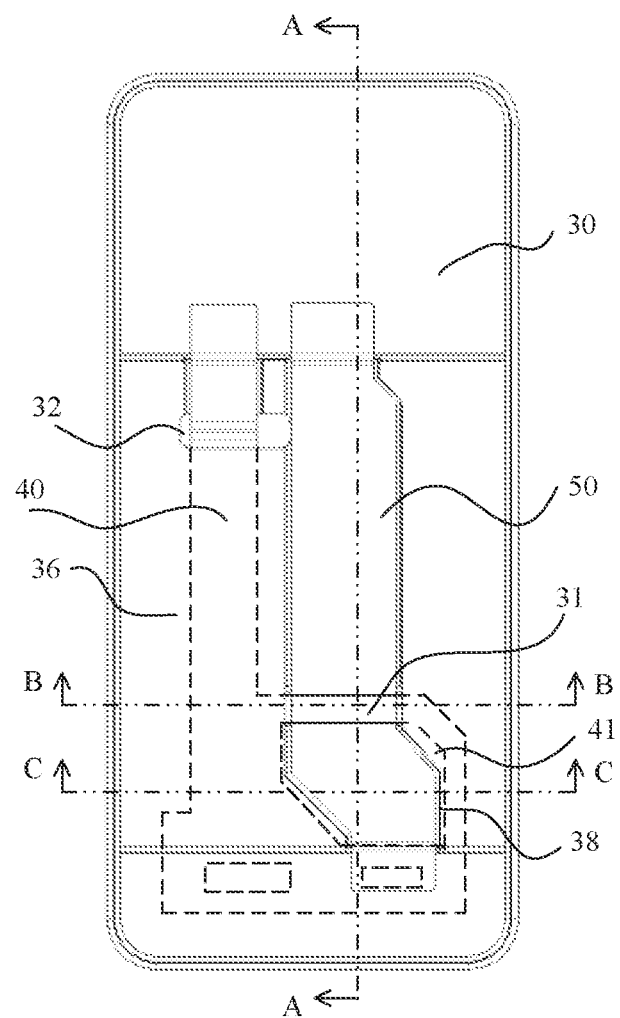
FIG. 9 is a perspective view of a partial inner structure of an electronic device according to an embodiment of this application.
Figure 10:
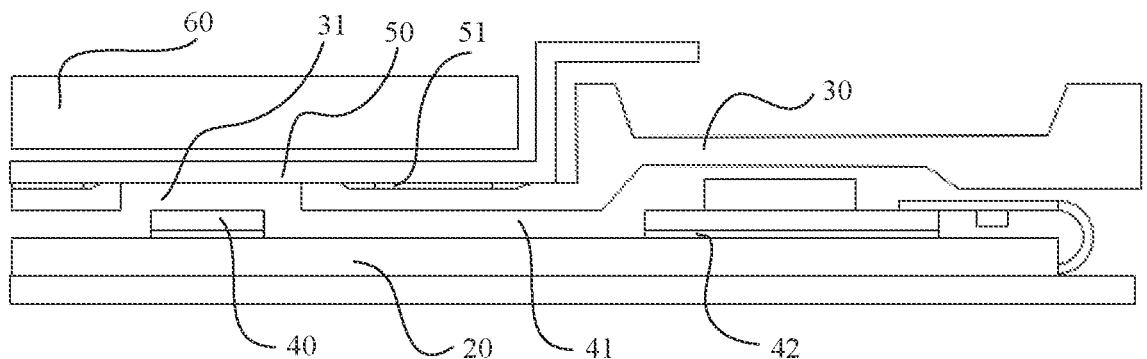
FIG. 10 is a sectional view in a direction A-A in FIG. 9.
Figure 11:
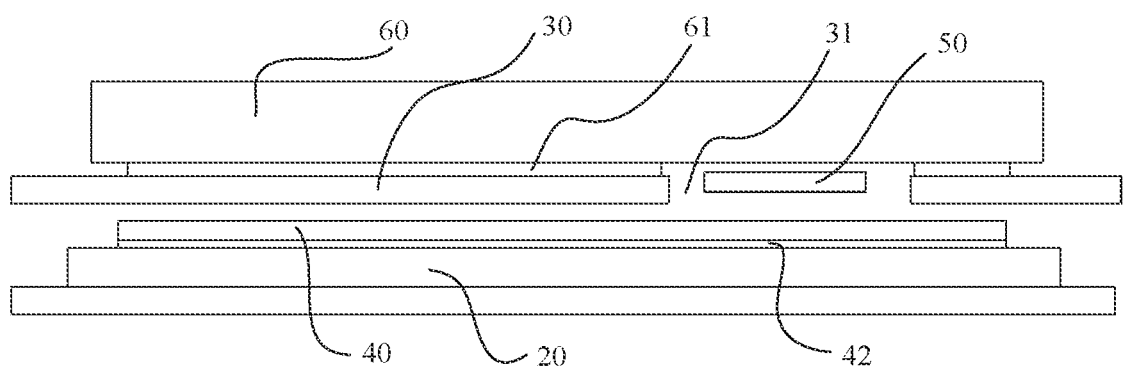
FIG. 11 is a sectional view in a direction B-B in FIG. 9.
Figure 12:
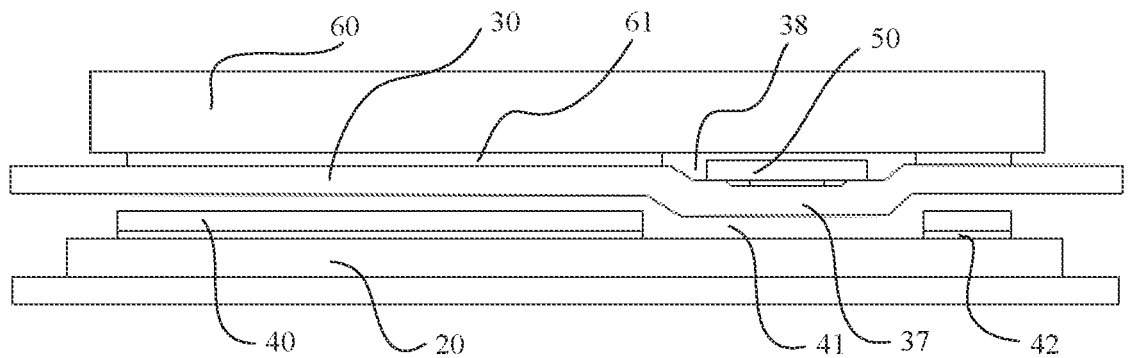
FIG. 12 is a sectional view in a direction C-C in FIG. 9.

FIG. 9 is a perspective view of a partial inner structure of the electronic device 100 according to an embodiment of this application. FIG. 10 is a sectional view in a direction A-A in FIG. 9. FIG. 11 is a sectional view in a direction B-B in FIG. 9. FIG. 12 is a sectional view in a direction C-C in FIG. 9.

As shown in FIG. 5 to FIG. 7. FIG. 9, and FIG. 12, in embodiments of this application, the middle frame 30 includes a protrusion part 37, a front end of the protrusion part 37 is embedded in the avoidance hole 41, and a rear end of the protrusion part 37 forms avoidance space 38 for accommodating the second FPC 50.

Specifically, a shape of the protrusion part 37 matches a shape and a size of the avoidance hole 41, the protrusion part 37 is embedded in the avoidance hole 41, and a front-end surface of the protrusion part 37 may be flush with a surface that is of the first FPC 40 and that is away from the middle frame 30. The second FPC 50 is accommodated in the avoidance space 38 on the opposite side.

In embodiments of this application, the protrusion part 37 and the avoidance space 38 are disposed, so that a region in the avoidance hole 41 also has a thickness of only two components (the middle frame 30 and the second FPC 50), which helps reduce the overall thickness of the electronic device 100. In this way, the overall thickness can be reduced, so that the electronic device 100 provides better user experience.

Optionally, the front end of the protrusion part 37 may extend into the avoidance hole 41, but is not embedded in the avoidance hole 41. For example, the front end of the protrusion part 37 may be disposed near (close to) the avoidance hole. In this case, a thinning effect can also be achieved.

In embodiments of this application, the middle frame 30 includes the protrusion part 37. The protrusion part 37 protrudes outward relative to a bottom wall of the first groove 33, and may or may not protrude relative to another part of the middle frame 30. To be specific, a height of a top end of the protrusion part 37 may be greater than, equal to, or less than a height of another part of the middle frame 30. This is not limited in this application.

As shown in FIG. 5 to FIG. 7 and FIG. 10 to FIG. 12, the first FPC 40 is fixedly attached to an inner surface of the display 20 of the electronic device 100 by using a first back adhesive layer 42, and the second FPC 50 is fixedly attached to the middle frame 30 by using a second back adhesive layer 51. The battery 60 may be fixedly attached to the middle frame 30 by using a third back adhesive layer 61.

Further, a third groove 35 is disposed on the middle frame 30 in the second groove 34, and the second back adhesive layer 42 is disposed in the third groove 35.

Optionally, a plurality of second back adhesive layers 51 may be disposed, and correspondingly, a plurality of third grooves 35 are disposed. This is not limited in this application. For example, as shown in FIG. 5, three second back adhesive layers 51 and three third grooves 35 may be correspondingly disposed, and are separated from each other, so that the first FPC 40 can be reliably fastened.

Figure 13:
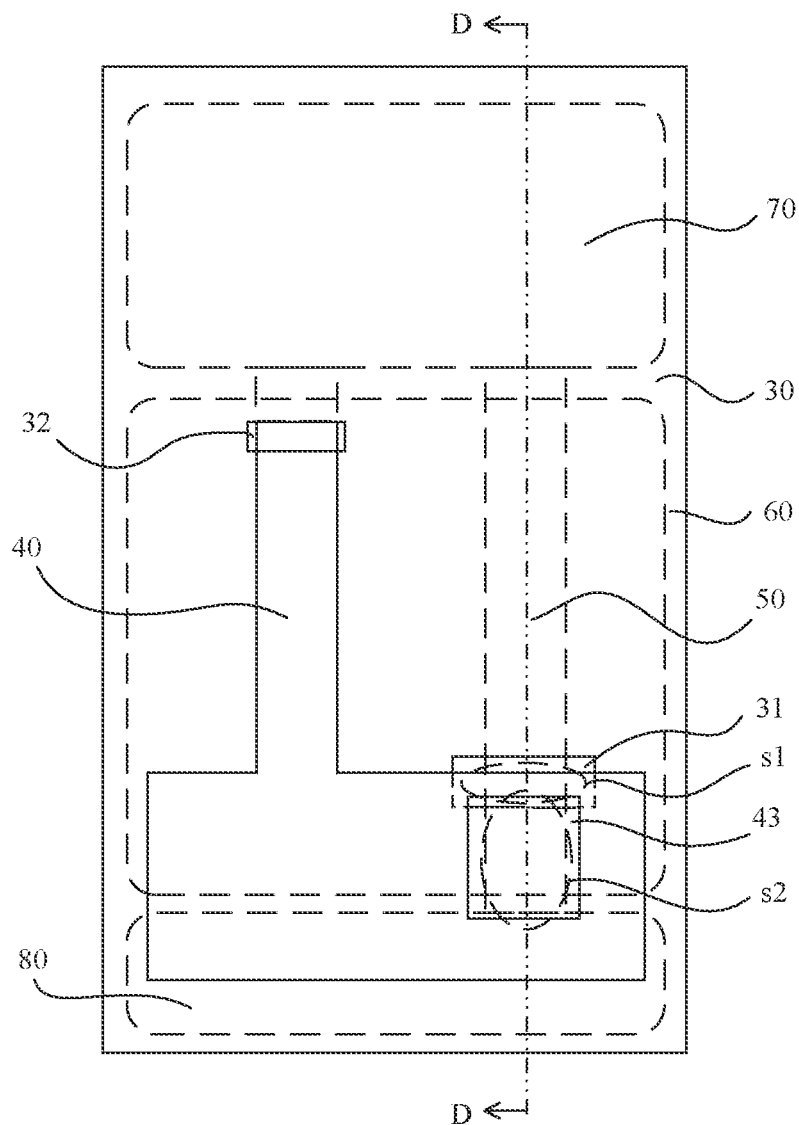
FIG. 13 is a schematic connection diagram of another example of a partial inner structure of an electronic device according to an embodiment of this application.
Figure 14:
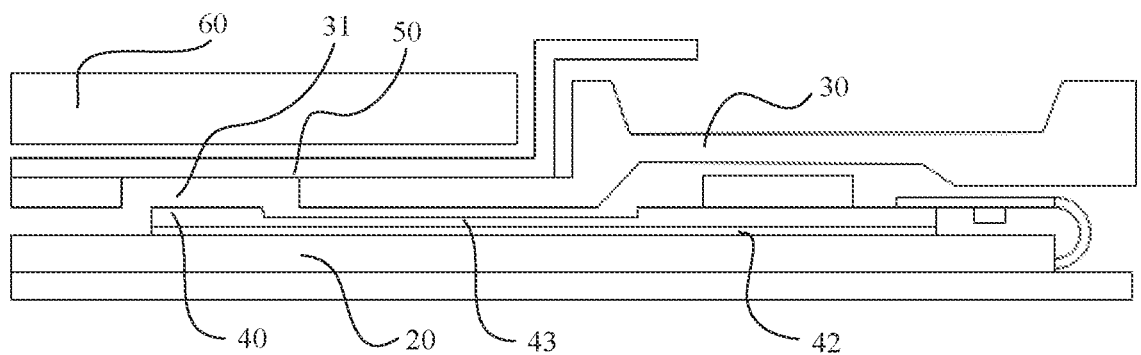
FIG. 14 is a sectional view in a direction D-D in FIG. 13.

FIG. 13 is a schematic connection diagram of another example of a partial inner structure of the electronic device 100 according to an embodiment of this application. FIG. 14 is a sectional view in a direction D-D in FIG. 13.

As shown in FIG. 13 and FIG. 14, the projections of the first FPC 40 and the second FPC 50 on the middle frame 30 have a second overlapping region s2, and the first FPC 40 further includes a thinning region 43. A thickness of the thinning region 43 is less than a thickness of another region of the first FPC 40, and a projection of the thinning region 43 on the middle frame 30 covers the second overlapping region s2.

In the foregoing embodiment, the avoidance hole 41 is disposed on the first FPC 40. In this embodiment, the first FPC 40 further includes the thinning region 43. The thinning region 43 is corresponding to the foregoing avoidance hole 41. The avoidance hole 41 in the foregoing embodiments is a through hole. Alternatively, the avoidance hole 41 may be a blind hole (that is, the first FPC 40 is not penetrated), to form the thinning region 43 in this embodiment. In other words, only a part of the first FPC 40 in a thickness direction is removed, and the first FPC 40 is not penetrated, to implement reduction by a specific thickness.

A shape and a size of the thinning region 43 are similar to those of the foregoing avoidance hole 41, and the projection of the thinning region 43 on the middle frame 30 covers the second overlapping region s2, that is, covers the second FPC 50 at a corresponding position.

Further, the second overlapping region s2 is connected to the first overlapping region s1. To be specific, in this case, the second overlapping region s2 is disposed to transfer the first overlapping region s1 to the inside of the projection of the battery 60 and make the first overlapping region s1 far away from the edge of the battery 60.

Figure 15:
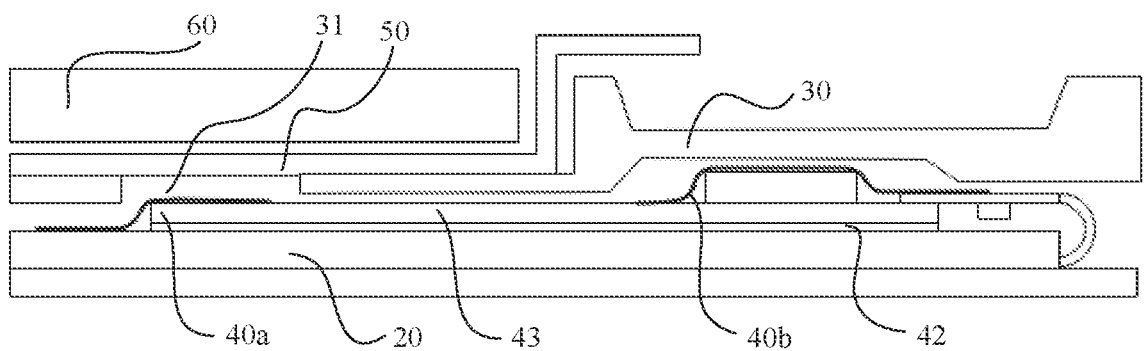
FIG. 15 is a schematic diagram of a structure of an example of the first FPC in FIG. 13.

FIG. 15 is a schematic diagram of a structure of an example of the first FPC 40 in FIG. 13.

As shown in FIG. 15, the first FPC 40 includes an FPC body 40a and a functional film layer 40b that are stacked, and thinning may be performed on the FPC body 40a and/or the functional film layer 40b to form the thinning region 43.

How to form the thinning region 43 is not limited in this application. In this embodiment, thinning may be performed on the functional film layer 40b to form the thinning region 43. In this case, a part or all of at least one functional film layer 40b covered by the FPC body 40a may be removed, to form the thinning region 43.

Optionally, the functional film layer 40b may include a protective film layer (insulation mylar). For example, the protective film layer may be a polyimide film (polyimide film, PI).

Optionally, only one protective film layer may cover the FPC body 40a.

Optionally, the functional film layer 40b may further include a shielding film layer, and the shielding film layer may be a metal (for example, copper) layer.

Optionally, the FPC body 40a may be successively covered with a protective film layer, a shielding film layer, and a protective film layer.

Optionally, the FPC body 40a may include at least one conductive layer.

For example, the FPC body 40a may be a single-layer board, a dual-layer board, or a multi-layer board (for example, three, four, or five-layer). This is not limited in this application.

Figure 16:
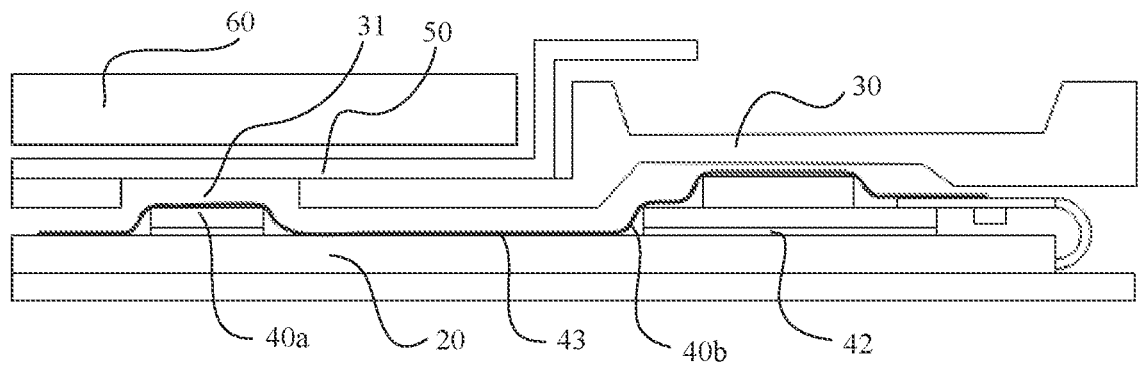
FIG. 16 is a schematic diagram of a structure of another example of the first FPC in FIG. 13.

FIG. 16 is a schematic diagram of a structure of another example of the first FPC 40 in FIG. 13.

As shown in FIG. 16, compared with the foregoing embodiment shown in FIG. 15, in this embodiment, the thinning region 43 is formed by performing thinning on the FPC body 40a. In this case, the FPC body 40a may be first thinned and then covered with the functional film layer 40b.

Optionally, a part or all of at least one conductive layer of the FPC body 40a may be removed, and then the FPC body 40a is covered with the functional film layer 40b, to form the thinning region 43.

For example, the FPC body 40a may be a multi-layer board. A part or all (for example, one layer) of the multi-layer board may be removed, and then the multi-layer board is covered with the functional film layer 40b, to form the thinning region 43.

Figure 17:
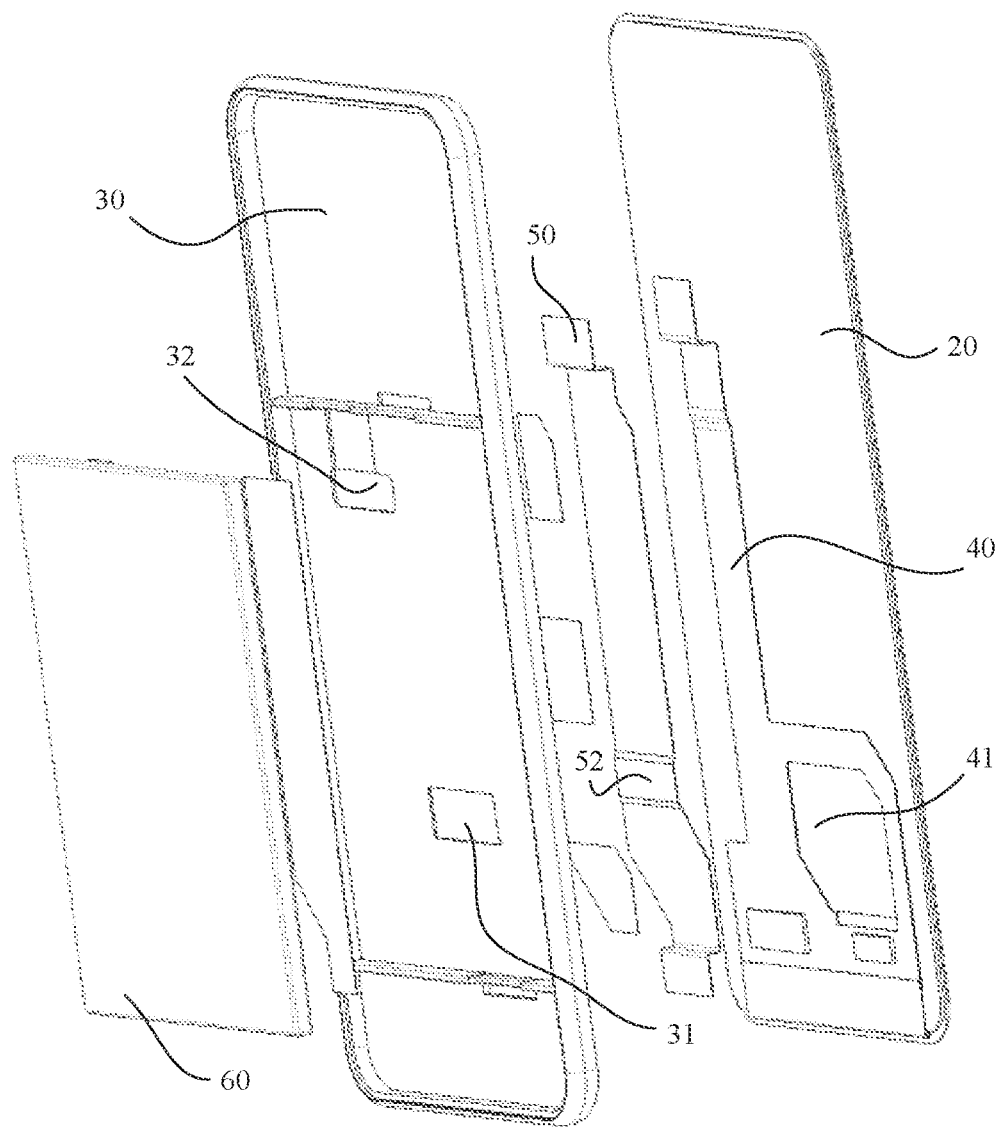
FIG. 17 is an exploded view of another example of an electronic device from a perspective according to an embodiment of this application.
Figure 18:
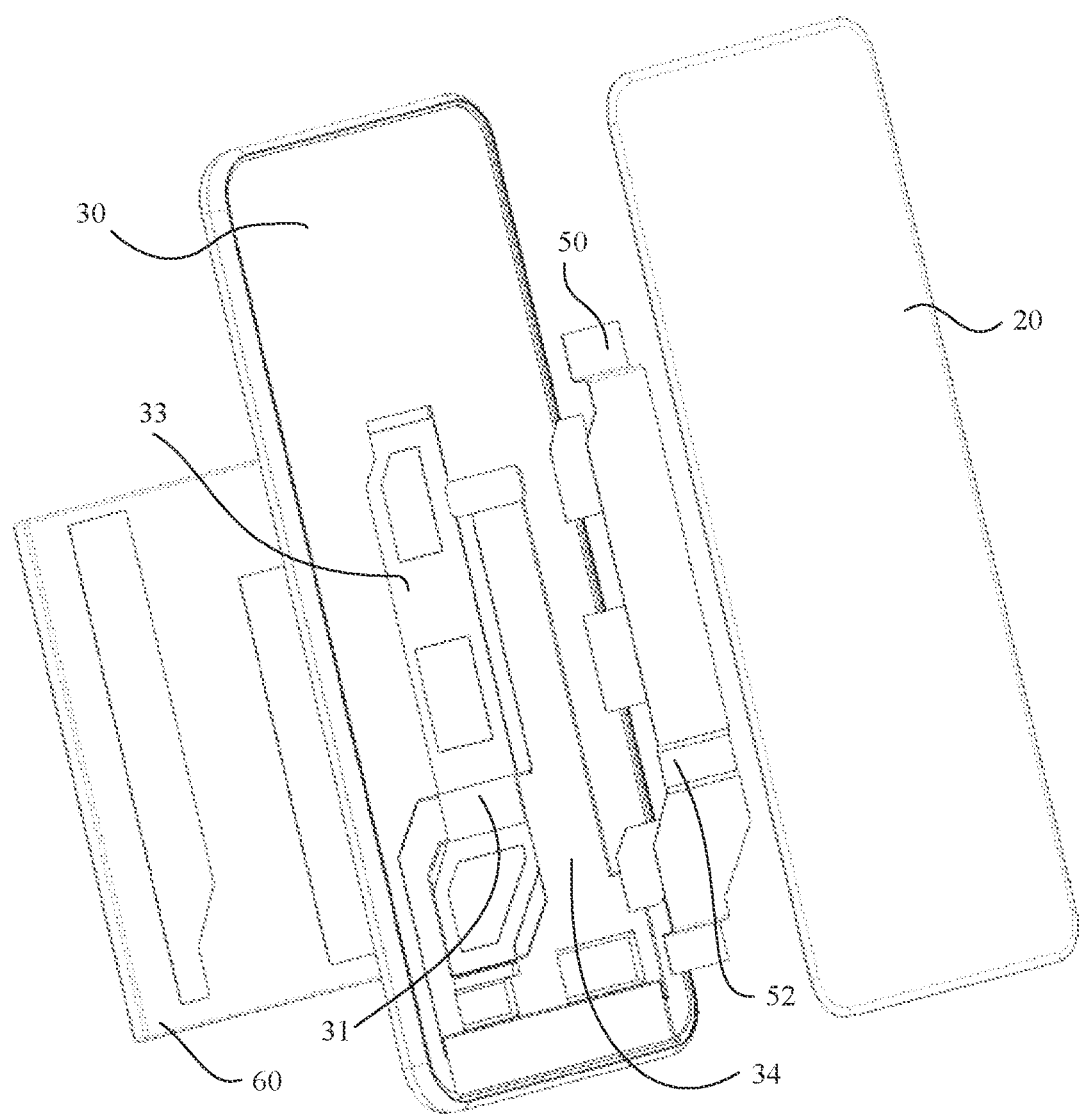
FIG. 18 is an exploded view of another example of an electronic device from another perspective according to an embodiment of this application.

FIG. 17 is an exploded view of another example of the electronic device 100 from a perspective according to an embodiment of this application. FIG. 18 is an exploded view of another example of the electronic device 100 from another perspective according to an embodiment of this application.

Compared with those of the foregoing electronic device 100 shown in FIG. 3 to FIG. 16, in this embodiment, the first FPC 40 and the second FPC 50 are located on a same side of the middle frame 30. To be specific, as shown in FIG. 17 and FIG. 18, in this embodiment, both the first FPC 40 and the second FPC 50 are located between the middle frame 30 and the display 20.

Optionally, in another implementation, the first FPC 40 and the second FPC 50 may alternatively be located between the middle frame 30 and the battery 60. This is not limited in this application.

In this case, the second FPC 50 is located between the middle frame 30 and the first FPC 40, and a bending part 52 may be disposed on the second FPC 50. A rear side of the bending part 52 is concave to form accommodation space, and the accommodation space accommodates the first FPC 40. A front side of the bending part 52 protrudes into the first through hole 31, for example, may be extended/embedded into the first through hole 31, to implement thinning.

Correspondingly, the first groove 33 and the second groove 34 may be disposed on a same side of the middle frame 30, the first FPC 40 is disposed in the first groove 33, and the second FPC 50 is disposed in the second groove 34. The first through hole 31 is disposed at an intersection of the first groove 33 and the second groove 34.

The foregoing descriptions are merely specific implementations of this application. However, the protection scope of this application is not limited thereto. Any change or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
a middle frame having a first through hole;
a first flexible printed circuit (FPC);
a second FPC; and
a battery;
wherein a first groove and a second groove are respectively disposed on two side surfaces of the middle frame, wherein the first FPC is disposed in the first groove, and the second FPC is disposed in the second groove, wherein projections of the first FPC and the second FPC on the middle frame have a first overlapping region, wherein the first overlapping region is located inside a projection of the battery on the middle frame and is far away from an edge of the battery, and wherein the first overlapping region is located in the first through hole.

2. The electronic device according to claim 1, wherein an avoidance hole is disposed on the first FPC, and wherein the first FPC avoids the second FPC by the avoidance hole, so that the first overlapping region is far away from the edge of the battery.

3. The electronic device according to claim 2, wherein the first FPC and the second FPC are respectively disposed on two opposite sides of the middle frame.

4. The electronic device according to claim 3, wherein the middle frame comprises a protrusion part, wherein a front end of the protrusion part extends into the avoidance hole, and wherein a rear end of the protrusion part forms avoidance space accommodating the second FPC.

5. The electronic device according to claim 1, wherein the projections of the first FPC and the second FPC on the middle frame have a second overlapping region, wherein the first FPC further comprises a thinning region, wherein a thickness of the thinning region is less than a thickness of another region of the first FPC, and a projection of the thinning region on the middle frame covers the second overlapping region.

6. The electronic device according to claim 5, wherein the first overlapping region is connected to the second overlapping region.

7. The electronic device according to claim 5, wherein the first FPC comprises an FPC body and a functional film layer that are stacked, and wherein the FPC body and the functional film layer are thinned to form the thinning region.

8. The electronic device according to claim 7, wherein the functional film layer comprises a protective film layer and a shielding film layer.

9. The electronic device according to claim 5, wherein the first FPC comprises an FPC body and a functional film layer that are stacked, and wherein the FPC body is thinned to form the thinning region.

10. The electronic device according to claim 5, wherein the first FPC comprises an FPC body and a functional film layer that are stacked, and wherein the functional film layer is thinned to form the thinning region.

11. The electronic device according to claim 1, wherein the first FPC is a screen FPC of the electronic device, and the second FPC is a main FPC of the electronic device.

12. The electronic device according to claim 11, wherein the first FPC is fixedly attached to an inner surface of a display of the electronic device by a first back adhesive layer, and the second FPC is fixedly attached to the middle frame by a second back adhesive layer.

13. The electronic device according to claim 12, wherein a third groove is further disposed on the middle frame in the second groove, and wherein the second back adhesive layer is disposed in the third groove.

14. The electronic device according to claim 11, wherein the first FPC passes through a second through hole and is electrically connected to a main board of the electronic device, wherein the second through hole is disposed on the middle frame.

15. The electronic device according to claim 1, wherein the first FPC and the second FPC are located on two opposite sides of the middle frame.

16. The electronic device according to claim 1, wherein contours of the first through hole and the first overlapping region overlap.

17. An electronic device, comprising:
a main board;
a middle frame having a first through hole and a second through hole;
a first flexible printed circuit (FPC) passing through the second through hole and being electrically connected to a main board;
a second FPC; and
a battery;
wherein a first groove and a second groove are respectively disposed on two side surfaces of the middle frame, wherein the first FPC is disposed in the first groove, and the second FPC is disposed in the second groove, wherein projections of the first FPC and the second FPC on the middle frame have a first overlapping region, wherein the first overlapping region is located inside a projection of the battery on the middle frame and is far away from an edge of the battery, and wherein the first overlapping region is located in the first through hole.

18. The electronic device according to claim 17, wherein an avoidance hole is disposed on the first FPC, and wherein the first FPC avoids the second FPC by the avoidance hole, so that the first overlapping region is far away from the edge of the battery.

19. The electronic device according to claim 17, wherein the first FPC is a screen FPC of the electronic device, and the second FPC is a main FPC of the electronic device.

* * * * *